United States Patent
Jiang et al.

(10) Patent No.: US 10,551,977 B2
(45) Date of Patent: Feb. 4, 2020

(54) PRESSURE DETECTION APPARATUS AND INTELLIGENT TERMINAL

(71) Applicant: SHENZHEN GOODIX TECHNOLOGY CO., LTD., Shenzhen, Guangdong (CN)

(72) Inventors: Hong Jiang, Guangdong (CN); Lin Feng, Guangdong (CN); Zhongbo Luo, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 152 days.

(21) Appl. No.: 15/798,075

(22) Filed: Oct. 30, 2017

(65) Prior Publication Data

US 2018/0081467 A1 Mar. 22, 2018

Related U.S. Application Data

(63) Continuation of application No. PCT/CN2016/099159, filed on Sep. 17, 2016.

(51) Int. Cl.
*G06F 3/045* (2006.01)
*G06F 3/044* (2006.01)
(Continued)

(52) U.S. Cl.
CPC .......... *G06F 3/044* (2013.01); *G06F 3/03545* (2013.01); *G06F 3/0416* (2013.01); *G06K 9/0002* (2013.01)

(58) Field of Classification Search
CPC .... G06F 3/044; G06F 3/03545; G06F 3/0416; G06K 9/0002
(Continued)

(56) References Cited

U.S. PATENT DOCUMENTS

2009/0140987 A1  6/2009  Yang
2011/0157087 A1  6/2011  Kanehira et al.
(Continued)

FOREIGN PATENT DOCUMENTS

CN  202256381 U  5/2012
CN  202815751 U  3/2013
(Continued)

OTHER PUBLICATIONS

Search report issued in corresponding European application No. 16899688.2 dated Nov. 21, 2018.

*Primary Examiner* — Jonathan M Blancha

(74) *Attorney, Agent, or Firm* — Heslin Rothenberg Farley & Mesiti P.C.

(57) ABSTRACT

A pressure detection apparatus includes: a drive power supply, a differential circuit, a pressure calculation unit, and at least one pressure sensor. Each pressure sensor includes a first electrode plate, a second electrode plate, a third electrode plate, a first elastic dielectric layer, and a second elastic dielectric layer. One detection capacitor is formed between the first electrode plate and the second electrode plate, and one detection capacitor is formed between the first electrode plate and the third electrode plate. The pressure sensor is connected between the drive power supply and an input terminal of the differential circuit, and an output terminal of the differential circuit is connected to the pressure calculation unit.

19 Claims, 7 Drawing Sheets

(51) Int. Cl.
*G06F 3/0354* (2013.01)
*G06F 3/041* (2006.01)
*G06K 9/00* (2006.01)

(58) Field of Classification Search
USPC .......................................................... 345/174
See application file for complete search history.

(56) References Cited

U.S. PATENT DOCUMENTS

| | | | |
|---|---|---|---|
| 2013/0141398 A1* | 6/2013 | Cho .................... | G06F 3/03545 345/179 |
| 2016/0085336 A1 | 3/2016 | Kim et al. | |
| 2016/0117035 A1 | 4/2016 | Watazu et al. | |
| 2016/0253030 A1* | 9/2016 | Tada ........................ | G06F 3/041 345/174 |
| 2017/0192533 A1* | 7/2017 | Hargreaves ......... | G06F 3/03545 |

FOREIGN PATENT DOCUMENTS

| | | |
|---|---|---|
| CN | 103308721 A | 9/2013 |
| CN | 204695260 U | 10/2015 |
| CN | 105067178 A | 11/2015 |
| WO | 2016083288 A1 | 6/2016 |

\* cited by examiner

PRESSURE DETECTION APPARATUS AND INTELLIGENT TERMINAL

CROSS-REFERENCE TO RELATED APPLICATION

This application is a continuation of International Patent Application No. PCT/CN2016/099159, with an international filing date of Sep. 17, 2016, which is hereby incorporated by reference herein, in its entirety.

TECHNICAL FIELD

The present disclosure relates to input device technologies, and in particular, to a pressure detection apparatus and an intelligent terminal.

BACKGROUND

Capacitive touch control technologies may sense whether there is a user's finger or other conductive object by a detection capacitor, and a corresponding function can be implemented simply by a light touch with a finger. Currently, touch screens have been widely applied to electronic devices, to implement touch control operations.

In the process of conceiving the present disclosure, the inventor finds that there are at least the following problems in the existing technologies:

(1) Existing electronic devices support only one-dimensional input, but cannot support multi-dimensional input, and pressure detection is not sufficiently accurate.

(2) A simple finger touch control function is only applicable to a limited number of application scenarios. This does not adapt to the development trend of technologies of integrating multiple application functions in one electronic device.

SUMMARY

According to some embodiments of the present disclosure, there are provided a pressure detection apparatus and an intelligent terminal, so as to improve detection precision of pressure detection. In addition, the versatility of the intelligent terminal can be achieved when the pressure detection apparatus is applied to the intelligent terminal.

To resolve the foregoing technical problems, according to an embodiment of the present disclosure, there is provided a pressure detection apparatus, including: a drive power supply, a differential circuit, a pressure calculation unit and at least one pressure sensor. Each pressure sensor includes a first electrode plate, a second electrode plate, a third electrode plate, a first elastic dielectric layer and a second elastic dielectric layer. The first electrode plate is disposed between the second electrode plate and the third electrode plate. The first elastic dielectric layer is disposed between the first electrode plate and the second electrode plate. The second elastic dielectric layer is disposed between the first electrode plate and the third electrode plate. One detection capacitor is formed between the first electrode plate and the second electrode plate, and one detection capacitor is formed between the first electrode plate and the third electrode plate. The pressure sensor is connected between the drive power supply and an input terminal of the differential circuit, and an output terminal of the differential circuit is connected to the pressure calculation unit. The pressure sensor is configured to output two detection voltages across two terminals of each of the two detection capacitors when the first electrode plate is subject to an external pressure. The differential circuit is configured to output a voltage difference of two detected voltages. The pressure calculation unit is configured to calculate the pressure according to the voltage difference.

According to another embodiment of the present disclosure, there is further provided an intelligent terminal, including the pressure detection apparatus in the first embodiment.

Compared with the existing technologies, in this embodiment of the present disclosure, the first electrode plate displaces or deforms when being subject to an external pressure. In this case, changes both occur in the detection capacitor formed between the first electrode plate and the second electrode plate, and the detection capacitor formed between the first electrode plate and the third electrode plate, and then the pressure sensor correspondingly outputs two detected voltages. The differential circuit outputs a voltage difference according to the two detected voltages, and then the pressure calculation unit calculates the pressure. Therefore, the detection precision of pressure detection is improved. In addition, the versatility of the intelligent terminal can be achieved when the pressure detection apparatus is applied to the intelligent terminal.

Further, the first electrode plate is connected to the drive power supply, and the second electrode plate and the third electrode plate are connected to the input terminal of the differential circuit respectively.

Further, the pressure detection apparatus further includes: at least one charge switch and at least one discharge switch. The first electrode plate is grounded. The second electrode plate and the third electrode plate are respectively connected to the drive power supply by using the charge switch, and are respectively connected to the input terminal of the differential circuit by using the discharge switch.

Further, there are two charge switches, and the second electrode plate and the third electrode plate are respectively connected to the drive power supply by using the two charge switches; and/or there are two discharge switches, and the second electrode plate and the third electrode plate are respectively connected to the input terminal of the differential circuit by using the two discharge switches. The two detection capacitors are charged when the charge switches are closed, and the two detection capacitors are discharged when the discharge switches are closed.

Further, there is one charge switch and the charge switch is a double-pole double-throw switch; and/or there is one discharge switch and the discharge switch is a double-pole double-throw switch. The two detection capacitors are charged when the charge switch is closed, and the two detection capacitors are discharged when the discharge switch is closed.

Further, the pressure detection apparatus further includes two adjustable capacitors; and the two adjustable capacitors are connected in parallel to the two detection capacitors respectively. The two adjustable capacitors are configured to adjust capacitance values of paths where each of the two detection capacitors locates, so that initial capacitance values of the paths where each of the two detection capacitors locates are equal when the first electrode plate is not subject to an external pressure. In this embodiment, by adjusting the two adjustable capacitors, a detection error caused by a tolerance that occurs during assembly can be avoided.

Further, initial capacitance values of paths where each of the two detection capacitors locates are unequal when the first electrode plate is not subject to an external pressure; the pressure detection apparatus further includes an adjustable capacitor, and the adjustable capacitor is connected in parallel to a detection capacitor on a path having a smaller initial capacitance value. The adjustable capacitor is configured to adjust a capacitance value of the path where the detection capacitor connected in parallel to the adjustable capacitor locates, so that the initial capacitance values of the paths where each of the two detection capacitors locates are equal when the first electrode plate is not subject to an external pressure. This embodiment provides another example for avoiding a detection error caused by a tolerance that occurs during assembly.

Further, there are multiple pressure sensors, and the pressure detection apparatus further includes a switching unit; the multiple pressure sensors are switchably connected to the differential circuit by using the switching unit. In this embodiment, multiple detected voltages output by the multiple pressure sensors can be switchably connected to the differential circuit by using the switching unit, thereby simplifying a circuit structure.

Further, the intelligent terminal is an active stylus. The active stylus further includes a stylus housing, a stylus core and an insulating stylus cap. The pressure detection apparatus is mounted in the stylus housing. One end of the stylus core is fixed to the first electrode plate of the pressure sensor. The insulating stylus cap is sleeved over the other end of the stylus core with a preset distance between the insulating stylus cap and the housing. The preset distance is greater than or equal to a maximum deformation distance of the first electrode plate. If the insulating stylus cap is subject to an external pressure, the pressure is applied on the first electrode plate of the pressure sensor by means of the stylus core. In this embodiment, a conventional active stylus is combined with the pressure detection apparatus, so that the conventional active stylus can simulate real pen writing, and provides higher sensitivity and precision.

Further, the intelligent terminal is an apparatus with fingerprint recognition. The apparatus with fingerprint recognition further includes a fingerprint recognition module that is configured to recognize a fingerprint of a user and a pressing element. One end of the pressing element is connected to the fingerprint recognition module, and the other end of the pressing element is connected to the first electrode plate of the pressure sensor. If the fingerprint recognition module is subject to an external pressure, the pressure is applied on the first electrode plate of the pressure sensor by means of the pressing element. In this embodiment, a conventional fingerprint recognition module is combined with the pressure detection apparatus, so that the conventional fingerprint recognition module can sense the value of a pressure, thereby achieving multi-dimensional input of the fingerprint recognition module.

Further, the intelligent terminal is a mobile terminal. The mobile terminal further includes a terminal housing, a display module and multiple pressing elements. The pressure detection apparatus is disposed in the terminal housing. The number of pressure sensors is the same as that of the pressing elements. One end of each of the multiple pressing elements is respectively fixed to the display module, and the other end of each of the multiple pressing elements is respectively fixed to the first electrode plate of each of the multiple pressure sensors. If the display module is subject to an external pressure, the pressure is applied on the first electrode plates of the multiple pressure sensors by means of the multiple pressing elements. In this embodiment, a conventional mobile terminal is combined with the pressure detection apparatus, so that a conventional intelligent terminal provides a function of a high-precision electronic scale, thereby multiple application functions are integrated, application scenarios of intelligent terminals are expanded, and user experiences are improved.

DETAILED DESCRIPTION

To make the objectives, technical solutions and advantages of the present disclosure clearer, embodiments of the present disclosure are described in detail below with reference to the accompanying drawings. However, a person of ordinary skill in the art can understand that in the embodiments of the present disclosure, many technical details are provided for a better understanding of this application by readers. Nevertheless, the technical solutions this disclosure seeks to protect can still be implemented without these technical details and various variations and modifications based on the embodiments below.

Figure 1:
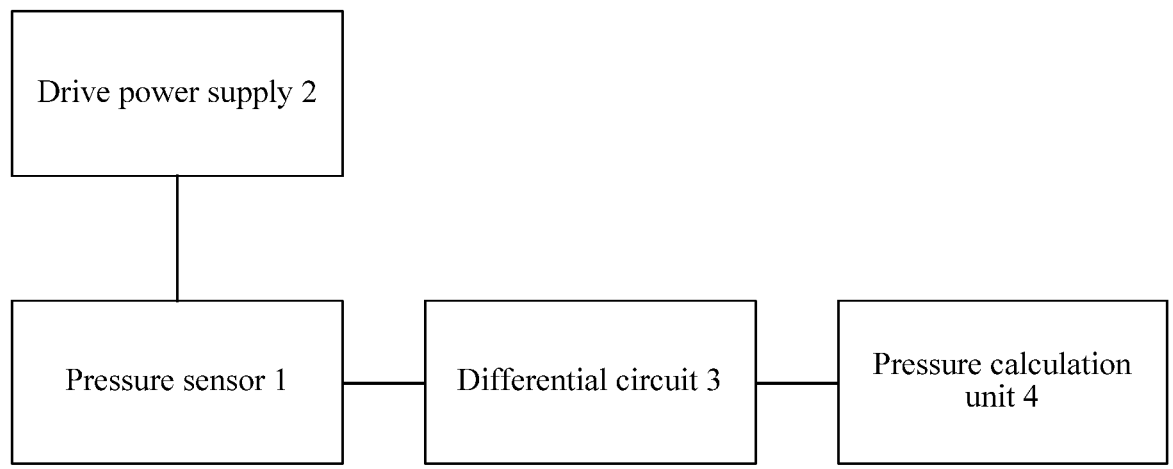
FIG. 1 is a block diagram of a pressure detection apparatus according to a first embodiment of the present disclosure.
Figure 2:
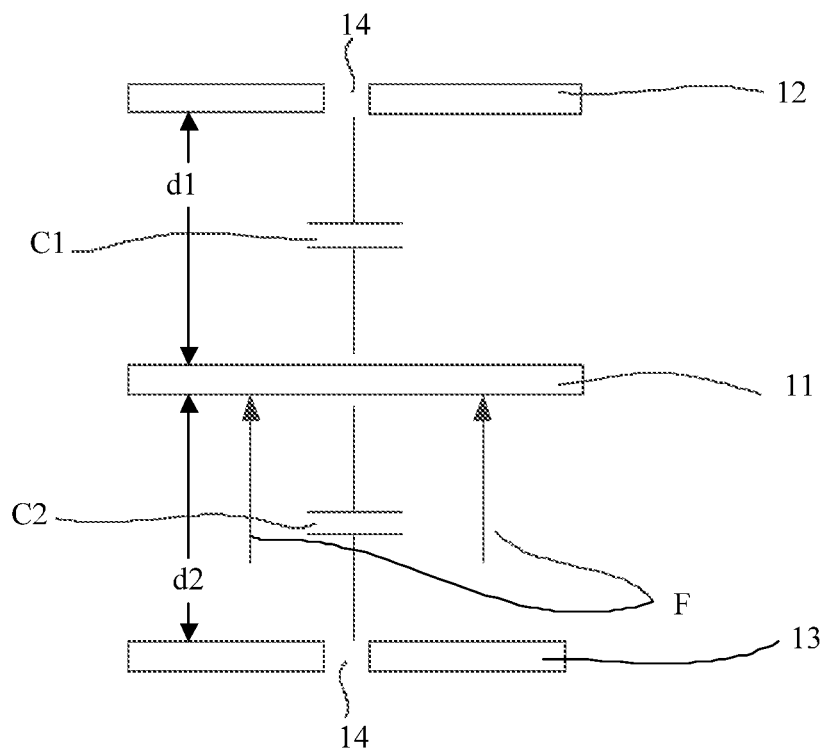
FIG. 2 is a schematic structural diagram of a pressure sensor according to the first embodiment of the present disclosure.

A first embodiment of the present disclosure relates to a pressure detection apparatus. As shown in FIG. 1 and FIG. 2, the pressure detection apparatus in this embodiment includes: a drive power supply 2, a differential circuit 3, a pressure calculation unit 4 and at least one pressure sensor 1.

In this embodiment, each pressure sensor 1 includes a first electrode plate 11, a second electrode plate 12, a third electrode plate 13, a first elastic dielectric layer and a second elastic dielectric layer. The first electrode plate 11 is disposed between the second electrode plate 12 and the third electrode plate 13. The first elastic dielectric layer is disposed between the first electrode plate 11 and the second electrode plate 12. The second elastic dielectric layer is disposed between the first electrode plate 11 and the third electrode plate 13. The first electrode plate 11 and the second electrode plate 12 form a detection capacitor C1, and the first electrode plate 11 and the third electrode plate 13 form a detection capacitor C2. The pressure sensor 1 outputs a detected voltage across two terminals of the detection capacitor C1 and a detected voltage across two terminals of the detection capacitor C2 when the first electrode plate 11 is subject to an external pressure F. Openings 14 (as shown in FIG. 2) may be respectively provided in the middle of the second electrode plate 12 and the third electrode plate 13, for applying external pressure on the first electrode plate 11. However, the embodiment is not limited thereto. An opening may be provided in one of the second electrode plate 12 and the third electrode plate 13. Alternatively, there is no need to provide an opening in the second electrode plate 12 or the third electrode plate 13, and a pressure may be externally applied on the first electrode plate through a side of the first electrode plate.

The pressure sensor 1 is connected between the drive power supply 2 and an input terminal of the differential circuit 3. An output terminal of the differential circuit 3 is connected to the pressure calculation unit 4. When the first electrode plate 11 is subject to the external pressure F, the pressure sensor 1 outputs the detected voltage across the two terminals of the detection capacitor C1 and the detected voltage across the two terminals of the detection capacitor C2. The differential circuit 3 is configured to output a voltage difference of the two detected voltages. The pressure calculation unit 4 is configured to calculate the pressure F according to the voltage difference.

Preferably, the elastic dielectric layers in this embodiment may be air. In actual applications, a housing of the pressure detection apparatus is grounded, and air may therefore serves as a preferred dielectric layer. Certainly, other elastic dielectric may alternatively be selected. However, the embodiment is not specifically limited thereto.

Figure 3:
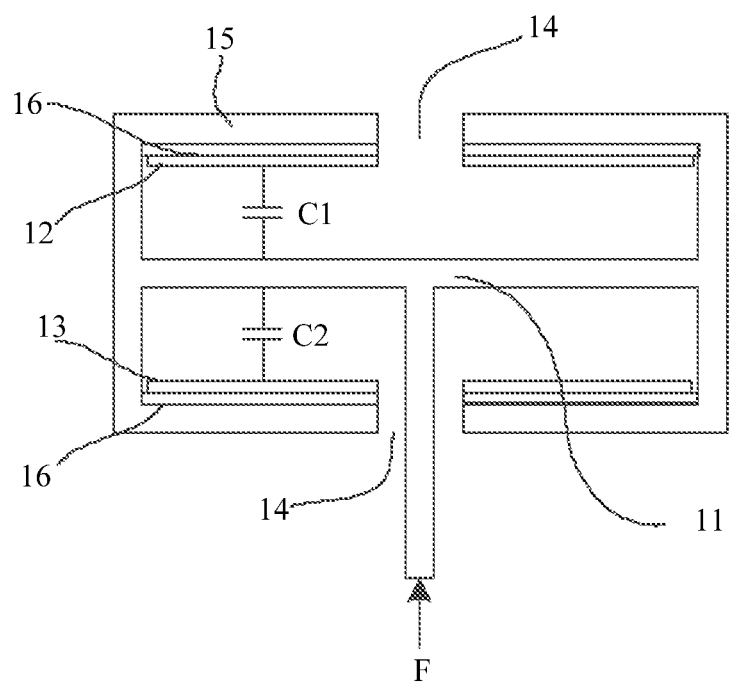
FIG. 3 is a first schematic structural diagram of the pressure sensor including a housing according to the first embodiment of the present disclosure.
Figure 4:
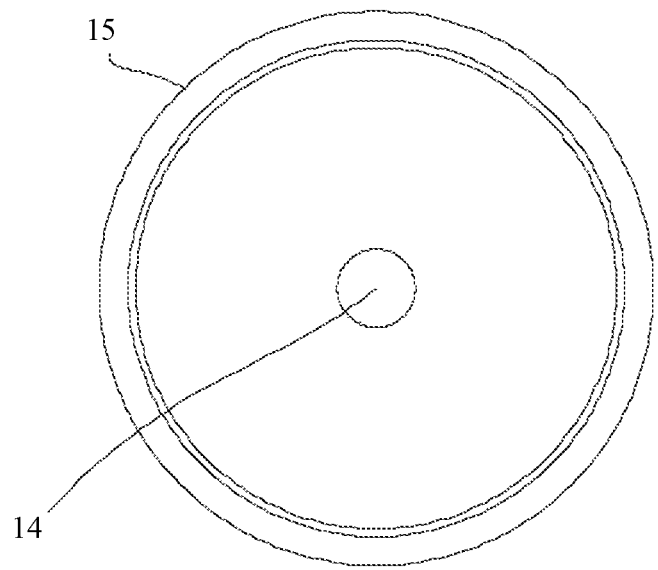
FIG. 4 is a top view of the pressure sensor in FIG. 3.
Figure 5:
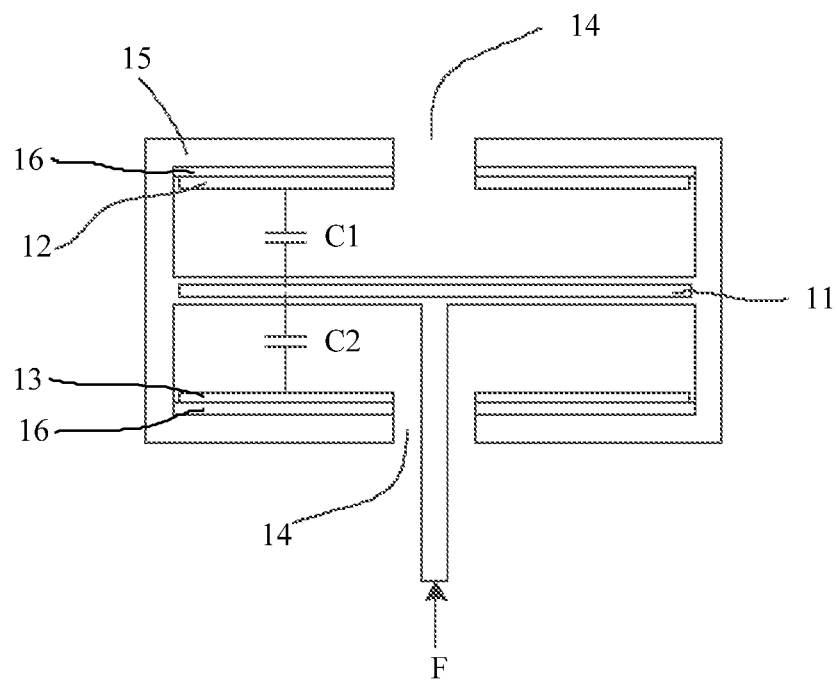
FIG. 5 is a second schematic structural diagram of the pressure sensor including a housing according to the first embodiment of the present disclosure.

In practice, as shown in FIG. 3, FIG. 4 and FIG. 5, the pressure sensor 1 may further include a housing 15 forming a cavity. The structure of the pressure sensor 1 in this embodiment may be in two structural forms.

FIG. 3 shows a first structural form of the pressure sensor 1. The pressure sensor 1 includes a housing 15 forming a cavity, the housing 15 is made of a metal material. Insulating layers 16 are respectively provided on an upper cavity wall and a lower cavity wall of the cavity. A cantilever is formed in the center of the housing 15, and two ends of the cantilever are respectively fixed to a left cavity wall and a right cavity wall of the cavity. The cantilever is equivalent to the first electrode plate 11 in FIG. 2. The upper cavity wall and the lower cavity wall respectively have openings 14 communicated thereto.

FIG. 4 is a top view of the structure of the pressure sensor 1 in FIG. 3 in this embodiment. The pressure sensor 1 includes the housing 15 and the opening 14. In other embodiments, the structure of the pressure sensor 1 is not limited to the structure provided in this embodiment, and may be in another shape such as a cylindrical shape, a rectangular shape, an elliptical shape or a diamond shape.

FIG. 5 shows a second structural form of the pressure sensor 1. The pressure sensor 1 includes a housing 15 forming a cavity. The housing 15 is made of a non-metal material. A metal layer is provided inside a cantilever in the center of the housing 15. That is, this may be understood as that the metal layer is fixed to a left cavity wall and a right cavity wall of the cavity by using the cantilever. The metal layer is equivalent to the first electrode plate 11 in FIG. 2. Conductive layers are respectively provided on an upper cavity wall and a lower cavity wall of the cavity, which are respectively equivalent to the second electrode plate 12 and the third electrode plate 13 in FIG. 2. Preferably, the second electrode plate 12 and the third electrode plate 13 may be respectively disposed on the upper cavity wall and the lower cavity wall of the cavity via an insulating layer 16. The upper cavity wall and the lower cavity wall respectively have openings 14 communicated thereto.

In this embodiment, the insulating layer 16 and the conductive layer may be implemented by using a flexible circuit board. Specifically, a substrate of the flexible circuit board is directly fixed on the cavity wall to form the insulating layer 16, and an exposed-copper area of the flexible circuit board form the conductive layer. That is, the exposed-copper area respectively forms the second electrode plate 12 and the third electrode plate 13. However, specific forms of the insulating layer 16, the second electrode plate 12, and the third electrode plate 13 are not limited in this embodiment, and the materials and shapes of the second electrode plate 12 and the third electrode plate 13 may be the same, or may be different.

The following specifically describes an actuation manner and principle of the pressure sensor 1 in this embodiment.

A distance between the first electrode plate 11 and the second electrode plate 12 is d1, and a distance between the first electrode plate 11 and the third electrode plate 13 is d2. In this embodiment, the structures, sizes and materials of the first electrode plate 11, the second electrode plate 12, and the third electrode plate 13 are all the same, and d1 and d2 are also the same. However, the embodiment is not limited thereto.

When there is no pressure applied on the first electrode plate 11, the first electrode plate 11 does not deform or displace. In this case, d1=d2, and C1=C2, and the two detected voltages output by the pressure sensor 1 are equal.

Specifically, when the third electrode plate 13 has an opening 14, an external pressing element passes through the opening 14 to apply an upward pressure F on the first electrode plate 11, and the first electrode plate 11 displaces upwardly, and a displacement is Δd. In this case, the distance between the first electrode plate 11 and the second electrode plate 12 decreases from d1 before pressing to (d1−Δd) after pressing, and d2 increases to (d2+Δd). Correspondingly, C1 is changed to (C1+ΔC1), and C2 is changed to (C2−ΔC2). In this case, a change between the two detection capacitors C1 and C2 is ΔC=(C1+ΔC1)−(C2−ΔC2)=ΔC1+ΔC2. When Δd is quite small relative to the values of d1 and d2, the following relationship holds, wherein k is a constant and is directly related to the structures, the sizes and the materials of the three electrode plates, and F is the pressure applied on the first electrode plate 11.

$$\Delta C = kF$$

In this embodiment, a direction of the pressure F applied on the first electrode plate 11 may further be determined by a sign of a difference between the two detection capacitors. When the second electrode plate 12 has the opening 14, the external pressing element passes through the opening 14 to apply, on the first electrode plate 11, a pressure with a direction being opposite to that of the pressure F, and the first electrode plate 11 deforms or displaces downwardly, and the displacement is Δd. In this case, the distance between the first electrode plate 11 and the second electrode plate 12 increases from d1 before pressing to (d1+Δd) after pressing, and d2 decreases to (d2−Δd). Correspondingly, C1 changes to (C1−ΔC1), and C2 changes to (C2+ΔC2). In this case, a change between the two detection capacitors C1 and C2 is ΔC=(C1−ΔC1)−(C2+ΔC2)=−(ΔC1+ΔC2). When Δd is quite small relative to the values of d1 and d2, the following relationship holds, wherein k is a constant and is directly relevant to the structures, the sizes and the materials of the three electrode plates, and F is the pressure applied on the first electrode plate 11.

$$\Delta C = -kF$$

In addition, the pressure sensor 1 provided in this embodiment provides a desirable suppression effect on an environmental condition change, for example, a temperature change. Specifically, assuming that when a temperature is T1, C1−C2=ΔC. When the temperature changes to T2, C1 changes to C1+ΔC1, and C2 changes to C2+ΔC2. Further, because the electrode shapes and areas of the first electrode plate 11, the second electrode plate 12 and the third electrode plate 13 are identical, ΔC1=ΔC2. Therefore, C1+ΔC1−(C2+ΔC2)=C1+−C2+(ΔC1−ΔC2)=ΔC. It can therefore be seen that the change of the environment temperature does not affect the difference between the detection capacitor C1 and the detection capacitor C2. That is, when temperatures are different, a difference of the capacitance values output by the pressure sensor 1 does not change. In this way, the anti-interference capability of a measurement circuit is greatly improved, and the measurement precision of the circuit is improved.

In this embodiment, it can be known from the above analysis that the difference ΔC between the detection capacitor C1 and the detection capacitor C2 in the pressure sensor 1 is directly linearly correlated to the pressure F applied on the first electrode plate 11. Because a voltage difference ΔV between the two detected voltages correspondingly output by the detection capacitor C1 and the detection capacitor C2 is positively correlated with the capacitance difference ΔC, the voltage difference ΔV is also linearly correlated to the pressure F. In this embodiment, the structure of the pressure sensor is designed to make the detected voltage output by the pressure sensor be linearly correlated to the pressure. Therefore, the pressure sensor could suppress the impact of an environmental condition change on circuit detection, and provides improved stability, and can be widely applied to severe environments such as high-temperature, low-temperature, and strong-irradiation environments.

Compared with existing technologies, in this embodiment, the differential circuit is utilized, so that the impact of an environmental condition change on circuit detection can be effectively suppressed. Because two electrical signals are input to two input terminals of the differential circuit, a difference between the two signals is an effective input signal of the circuit. If an interfering signal exists, the two input electrical signals are subject to equal interferences. By calculating the difference between the two signals, common-mode interferences on the two detection capacitors are canceled, common-mode noise inside the circuit is reduced, and an effective input of the interfering signal is zero.

Certainly, the differential circuit in this embodiment can be implemented by using a fully differential amplifier, or two single-ended amplifiers for differential detection. Details are not described repeatedly herein.

Figure 6:
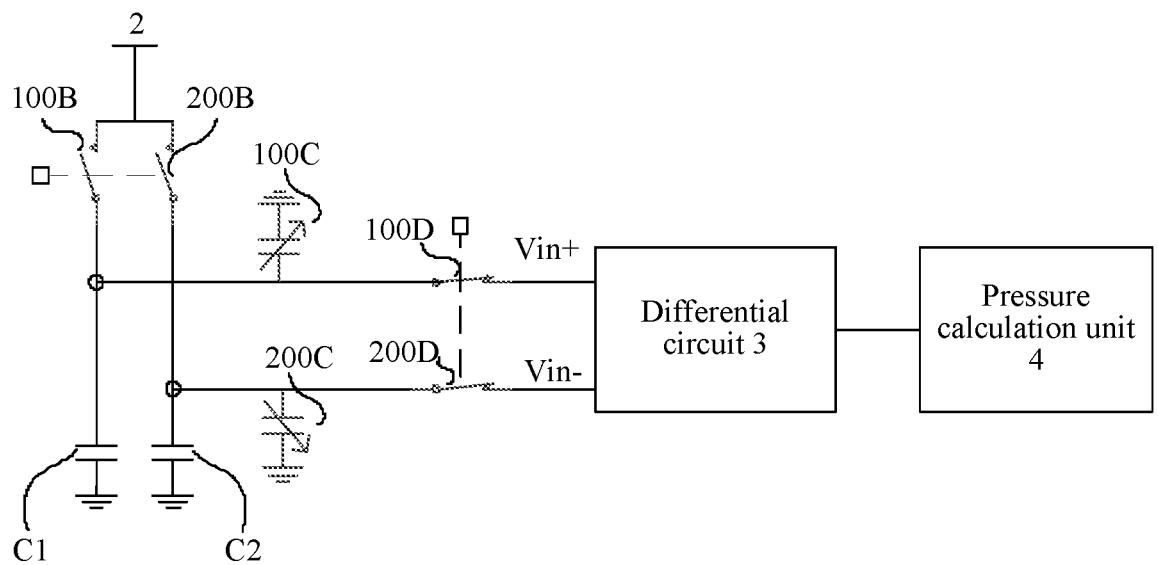
FIG. 6 is a circuit principle diagram of a pressure detection apparatus according to a second embodiment of the present disclosure.

A second embodiment of the present disclosure relates to a pressure detection apparatus. FIG. 6 is a circuit principle diagram of the pressure detection apparatus using self-capacitance detection in this embodiment. In this embodiment, the pressure detection apparatus further includes: a charge switch 100B and a charge switch 200B, a discharge switch 100D and a discharge switch 200D.

In this embodiment, as an example, there are two charge switches and two discharge switches. C1 in FIG. 6 is equivalent to the detection capacitor C1 in FIG. 2, and C2 in FIG. 6 is equivalent to the detection capacitor C2 in FIG. 2. Grounded terminals of C1 and C2 in FIG. 6 are equivalent to the first electrode plate in FIG. 2. A terminal, connected to the drive power supply 2 by using the charge switch 100B, of C1 in FIG. 6 is equivalent to the second electrode plate in FIG. 1. A terminal, connected to the drive power supply 2 by using the charge switch 200B, of C2 in FIG. 6 is equivalent to the third electrode plate in FIG. 1. The charge switch 100B and the charge switch 200B are configured to charge C1 and C2 during pressure detection. C1 is connected to a positive input terminal Vin+ of a differential circuit 3 by using the discharge switch 100D. C2 is connected to a negative input terminal Vin− of the differential circuit 3 by using the discharge switch 200D. The discharge switch 100D and the discharge switch 200D are configured to discharge C1 and C2 during pressure detection. An output terminal of the differential circuit 3 is connected to a pressure calculation unit 4.

Specifically, when the charge switch 100B and the charge switch 200B are closed and the discharge switch 100D and the discharge switch 200D are open, C1 and C2 are charged. When the charge switch 100B and the charge switch 200B are open and the discharge switch 100D and the discharge switch 200D are closed, C1 and C2 enter a discharging state.

Certainly, in other embodiments, the number of charge switches or discharge switches is not limited to the description in this embodiment. There may be one charge switch and the charge switch is a double-pole double-throw switch, and/or there may be one discharge switch and the discharge switch is a double-pole double-throw switch. In this way, technical effects can be achieved the same as those of the technical solution described in this embodiment. It should be noted that the number of charge switches and the number of discharge switches may be equal, or may be unequal.

In this embodiment, preferably, the pressure detection apparatus further includes an adjustable capacitor 100C and an adjustable capacitor 200C. C1 is electrically connected to the adjustable capacitor 100C, and C2 is electrically connected to the adjustable capacitor 200C. By adjusting the adjustable capacitor 100C and the adjustable capacitor 200C, a matching relationship between a capacitance value of C1 and a capacitance value of C2 during the pressure detection can be adjusted.

Specifically, an error occurs during assembly of a press sensor. That is, a difference exists between the detection capacitor C1 and the detection capacitor C2 when no pressure is applied. A capacitance difference caused by the assembly error is transmitted to the differential circuit, resulting in incorrect electrical signal transmission. In this case, by adjusting the matching relationship between the adjustable capacitor 100C and the adjustable capacitor 200C, for example, by adjusting only the adjustable capacitor 100C and/or by adjusting the second adjustable capacitor 200C, an output of the differential circuit is 0 when no pressure is applied.

It should be noted that in other embodiments, there is no need to configure the adjustable capacitor 100C and the adjustable capacitor 200C at the same time. Instead, either the adjustable capacitor 100C or the adjustable capacitor 200C may be configured. As an example, a capacitance value of the detection capacitor C1 may be designed to be less than a capacitance value of the detection capacitor C2. In this case, the pressure detection apparatus includes the adjustable capacitor 100C, and 100C is connected in parallel to the detection capacitor C1. When no pressure is applied, the output of the differential circuit can be ensured to be 0 by adjusting the adjustable capacitor 100C.

In this embodiment, the pressure sensor included in the pressure detection apparatus has a structure for self-capacitance detection, and a structural form of the pressure sensor in actual applications may be shown in FIG. 3. In this case, in FIG. 3, a housing 15 is connected to a ground plane (a cantilever of the housing serves as a first electrode plate 11, namely the first electrode plate 11 is grounded), and two conductive layers are respectively connected to a drive power supply 2 (namely a second electrode plate 12 and a third electrode plate 13 are connected to the drive power supply 2). Therefore, the circuit structure is simpler.

Figure 7:
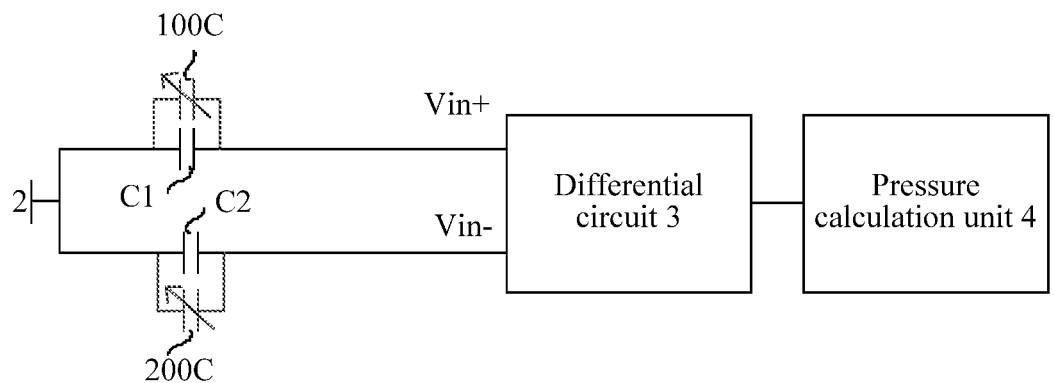
FIG. 7 is a circuit principle diagram of a pressure detection apparatus according to a third embodiment of the present disclosure.

A third embodiment of the present disclosure relates to a pressure detection apparatus. FIG. 7 is a circuit principle diagram of the pressure detection apparatus using mutual-capacitance detection in this embodiment. In this embodiment, a first electrode plate (referring to FIG. 5) of a pressure sensor is connected to a drive power supply 2. A second electrode plate (referring to FIG. 5) of the pressure sensor is connected to a positive input terminal Vin+ of a differential circuit 3, and a third electrode plate 13 (referring to FIG. 5) is connected to a negative input terminal Vin− of the differential circuit 3. An output terminal of the differential circuit 3 is connected to a pressure calculation unit 4.

In this embodiment, preferably, the pressure detection apparatus further includes an adjustable capacitor 100C and an adjustable capacitor 200C. For a detailed analysis, refer to the second embodiment of the present disclosure, and details are not described repeatedly herein.

In this embodiment, the pressure sensor included in the pressure detection apparatus has a structure for mutual-capacitance detection, and a structural form of the pressure sensor in actual applications may be shown in FIG. 5. That is, a metal layer (that is, the first electrode plate 11) of the pressure sensor in FIG. 5 is connected to the drive power supply 2. Compared with the principle of the self-capacitance detection, the first electrode plate of the pressure sensor is connected to the drive power supply 2, and therefore does not produce a parasitic load capacitance. Therefore, the pressure detection apparatus in this embodiment provides a higher capacitance variability rate, and higher detection precision.

Figure 8:
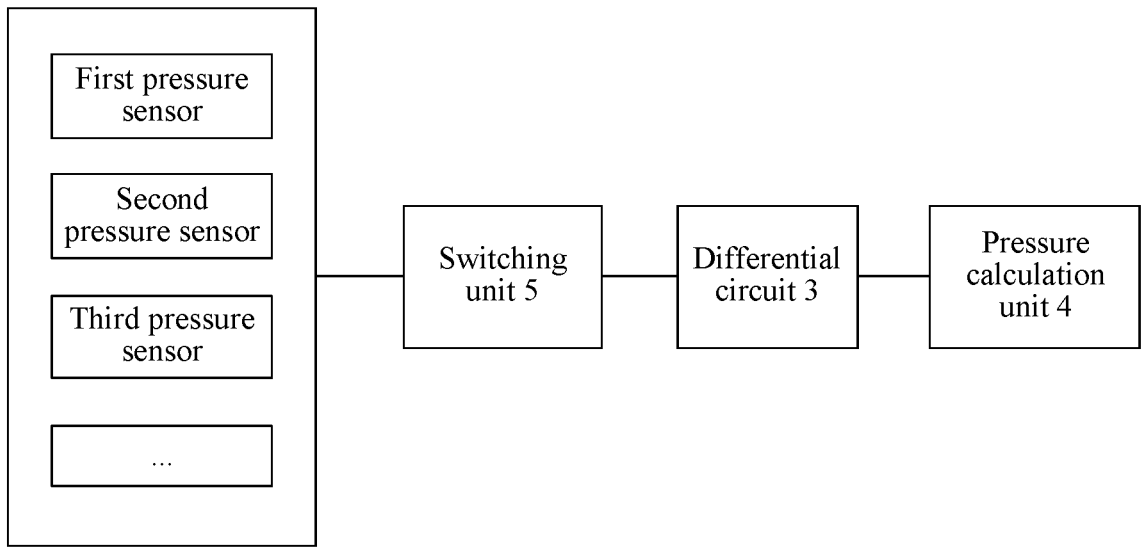
FIG. 8 is a block diagram of a pressure detection apparatus according to a fourth embodiment of the present disclosure.

A fourth embodiment of the present disclosure relates to a pressure detection apparatus, and a schematic block diagram is shown in FIG. 8. This embodiment is an improvement to the first embodiment. Main improvements lie in that there are multiple pressure sensors in the pressure detection apparatus, and the pressure detection apparatus further includes a switching unit 5, for switchably connecting the multiple pressure sensors to a differential circuit 3.

Specifically, during actual applications of the pressure detection apparatus, there may be multiple force points. Therefore, multiple pressure sensors need to be provided in the case of multiple force points, and each pressure sensor respectively outputs two detected voltages. At a first moment, the switching unit 5 transmits two detected voltages of a first pressure sensor to the differential circuit 3, and at a second moment, the switching unit 5 transmits two detected voltages of a second pressure sensor to the differential circuit 3, and so on. In this way, by using the switching unit 5, every two detected voltages output by each of the multiple pressure sensors are switchably connected to the differential circuit 3, so that the pressure calculation unit 4 calculates pressures.

A fifth embodiment of the present disclosure relates to an intelligent terminal, which may be, for example, an active stylus or a smart phone or the like. The intelligent terminal in this embodiment includes the pressure detection apparatus in any one of the first to the fourth embodiments.

Compared with existing technologies, the intelligent terminal provided in this embodiment can implement multi-dimensional input, thereby expanding application scenarios of the pressure detection apparatus.

Figure 9:
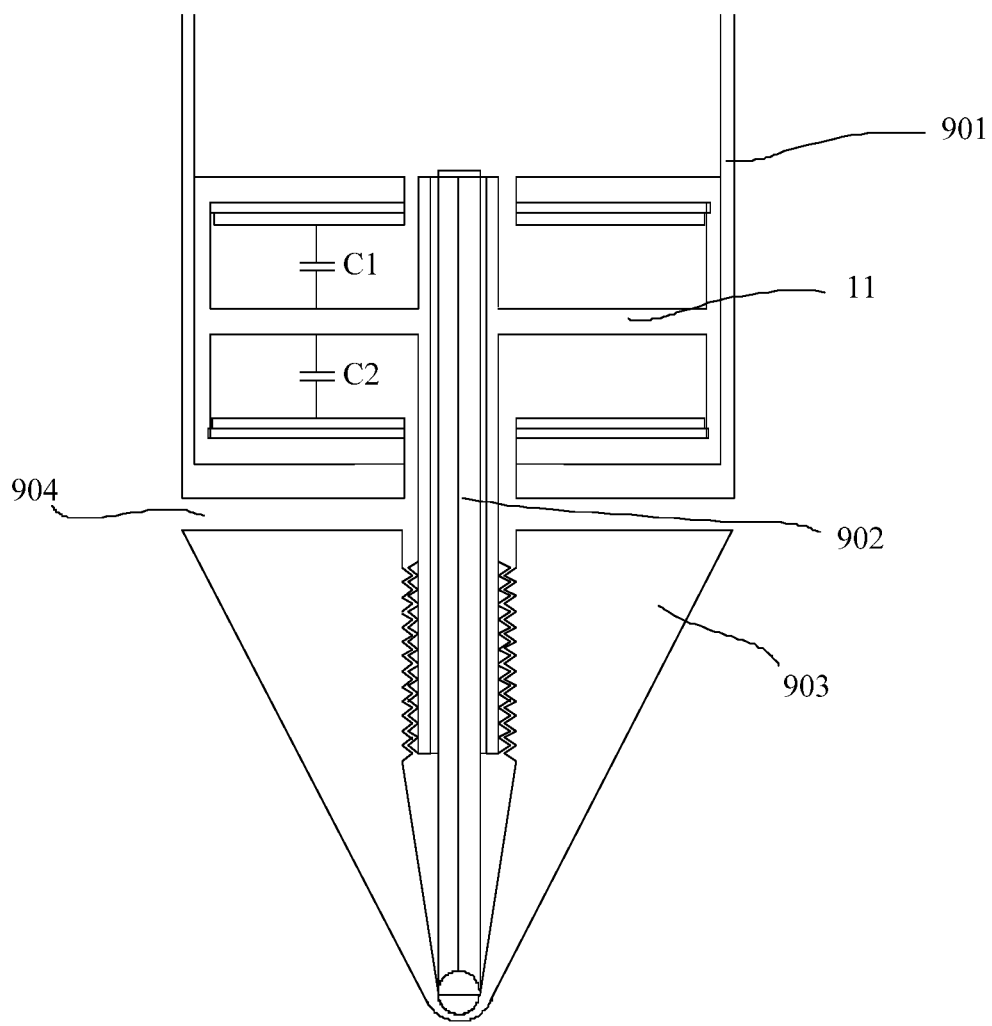
FIG. 9 is a schematic structural diagram of an intelligent terminal according to a sixth embodiment of the present disclosure.

A sixth embodiment of the present disclosure relates to an intelligent terminal. This embodiment is an improvement to the fifth embodiment. Main improvements lie in that the intelligent terminal in this embodiment is an active stylus, and the active stylus includes the pressure detection apparatus in any one of the first to the fourth embodiments. A schematic structural diagram of the active stylus is shown in FIG. 9. The active stylus further includes: a stylus housing 901, a stylus core 902 and an insulating stylus cap 903.

The pressure detection apparatus is mounted in the stylus housing. One end of the stylus core 902 is fixed to the first electrode plate 11 of the pressure sensor. The insulating stylus cap 903 is sleeved over the other end of the stylus core 902 with a preset distance 904 between the insulating stylus cap 903 and the housing. The preset distance 904 is greater than or equal to a maximum deformation distance of the first electrode plate 11. If the insulating stylus cap 903 is subject to an external pressure, the pressure is applied to the first electrode plate 11 of the pressure sensor by means of the stylus core 902.

Specifically, in this embodiment, the pressure sensor includes a housing, and the housing of the pressure sensor is directly fixed to the stylus housing 901. In actual applications, the housing of the pressure sensor may be integrated with the stylus housing 901. One end of the stylus core 902 passes through an opening of the third electrode plate and is fixed to the first electrode plate 11 of the pressure sensor. The insulating stylus cap 903 is sleeved over the other end of the stylus core 902 and with the preset distance 904 between the insulating stylus cap 903 and the stylus housing 901. The preset distance 904 is greater than or equal to the maximum deformation distance of the first electrode plate 11 during deformation. It should be noted that one end of the stylus core 902 may alternatively be fixed to a side wall of the first electrode plate 11 of the pressure sensor. That is, without an opening in the third electrode plate, a pressure can still be applied on the first electrode plate 11 of the pressure sensor by using one end of the stylus core 902.

When a pressure is applied on the insulating stylus cap 903, the pressure may be applied on the first electrode plate 11 of the pressure sensor by means of the stylus core 902. In this case, a maximum travel range of a stylus tip is the preset distance 904. Compared with existing technologies, the design of the stylus tip structure of the active stylus with the pressure detection apparatus in this embodiment is quite simple. Because a conventional active stylus is added with the structure of the pressure sensor, the active stylus can sense a pressure. Because the stylus tip has a quite small travel distance, the active stylus provides writing experience similar to that of a real pen, and can achieve desirable user experiences.

A seventh embodiment of the present disclosure relates to an intelligent terminal. This embodiment is an improvement to the fifth embodiment. A main improvement lies in that the intelligent terminal in this embodiment is an apparatus with fingerprint recognition. The apparatus with fingerprint recognition includes the pressure detection apparatus in any one of the first to the fourth embodiments.

Figure 10:
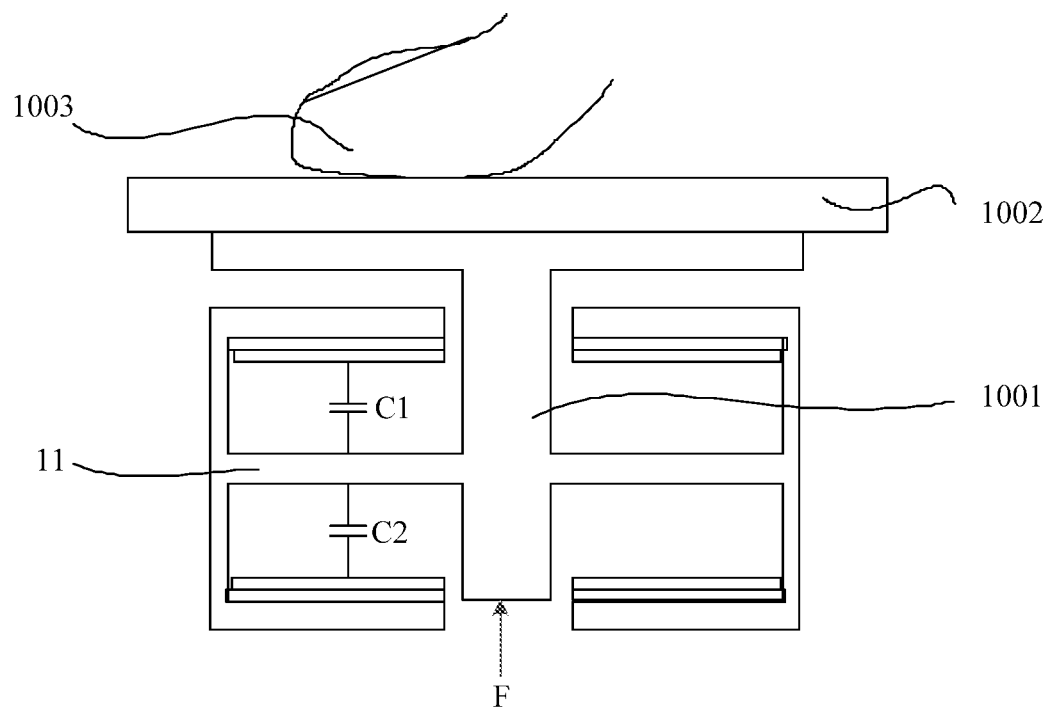
FIG. 10 is a schematic structural diagram of an intelligent terminal according to a seventh embodiment of the present disclosure.

As shown in FIG. 10, the apparatus with fingerprint recognition further includes a fingerprint recognition module 1002 that is configured to recognize a fingerprint of a user and a pressing element 1001. One end of the pressing element 1001 is connected to the fingerprint recognition module 1002, and the other end of the pressing element 1001 is connected to the first electrode plate 11 of the pressure sensor. If the fingerprint recognition module 1002 is subject to an external pressure F, the pressure is applied on the first electrode plate 11 of the pressure sensor by means of the pressing element 1001.

Specifically, the pressure sensor is located below the fingerprint recognition module 1002. A finger 1003 presses the fingerprint recognition module 1002. The pressure F is transmitted to the pressure sensor by means of the pressing element 1001. The value of the pressure F of the finger can be detected according to the principles in the first embodiment to the fourth embodiment of the present disclosure. In actual applications, the pressure detection apparatus in this embodiment may alternatively be designed as a separate pressure key on a mobile terminal, so as to add a linear input dimension.

It should be noted that the pressing element in this embodiment needs to be triggered by an external pressure to drive the first electrode plate to displace. The pressing element may be directly integrated with/located on the fingerprint recognition module, or independent from the fingerprint recognition module. For example, a surface of the fingerprint recognition module may be directly pressed, to drive the first electrode plate to displace by means of a mechanical structure.

By means of the intelligent terminal in this embodiment, pressure perception of the intelligent terminal can be achieved. The intelligent terminal can recognize whether an action is a click action or a press action and whether an action is a light press or a heavy press, so as to invoke a corresponding function, thereby adding a linear input dimension to the intelligent terminal.

An eighth embodiment of the present disclosure relates to an intelligent terminal. This embodiment is an improvement to the fifth embodiment. A main improvement lies in that the intelligent terminal in this embodiment is a mobile terminal. The mobile terminal includes the pressure detection apparatus in any one of the first to the fourth embodiments.

Figure 11:
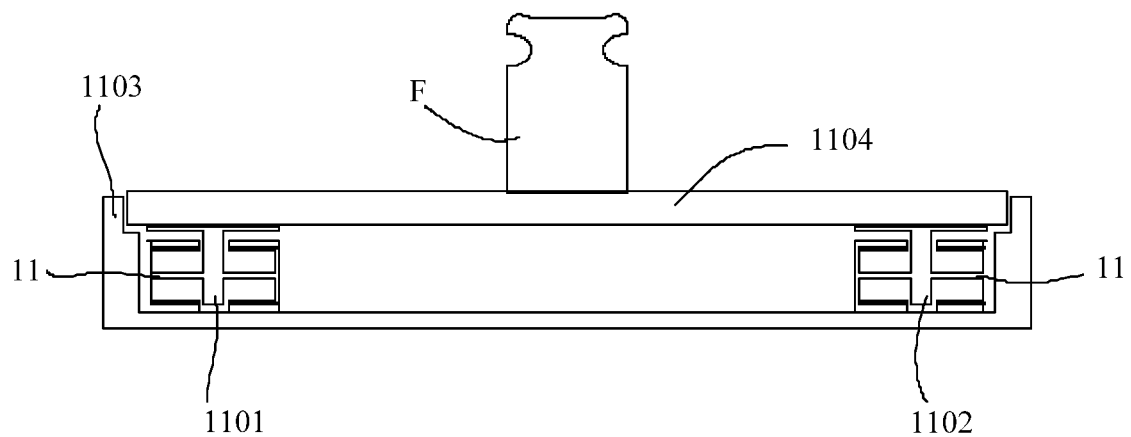
FIG. 11 is a side view of an intelligent terminal according to an eighth embodiment of the present disclosure.

FIG. 11 shows a schematic structural diagram of the mobile terminal. The mobile terminal further includes a terminal housing 1103, a display module 1104 and multiple pressing elements. The pressure detection apparatus is disposed in the terminal housing 1103. The number of pressure sensors is the same as that of pressing elements. One end of each of the multiple pressing elements is respectively fixed to the display module 1104, and the other end of each of the multiple pressing elements is respectively fixed to the first electrode plate 11 of each of the multiple pressure sensors. If the display module 1104 is subject to an external pressure F, the pressure is applied on the first electrode plates 11 of the multiple pressure sensors by means of the multiple pressing elements.

Figure 12:
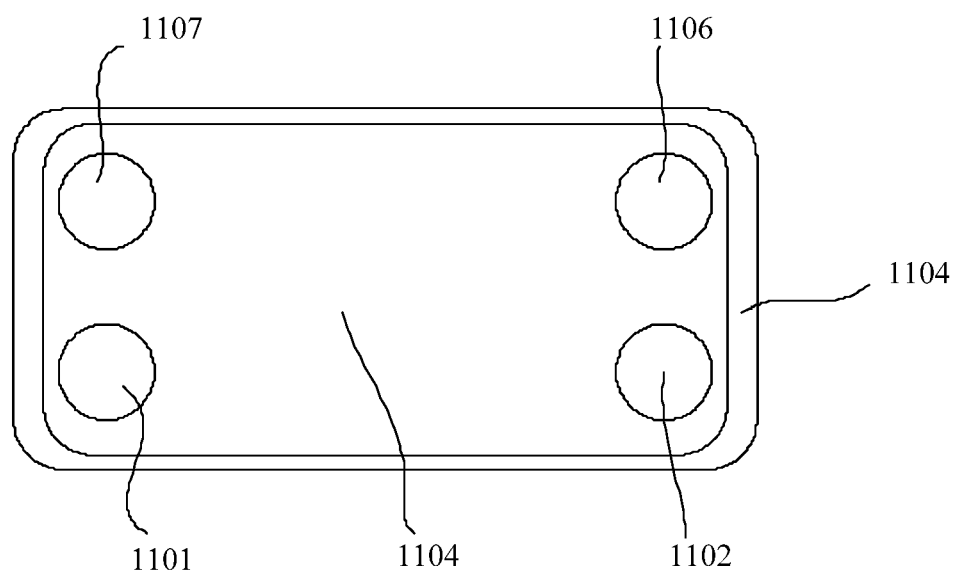
FIG. 12 is a top view of the intelligent terminal according to the eighth embodiment of the present disclosure.

Specifically, in this embodiment, as an example, there are four pressing elements. As shown in FIG. 12, the four pressing elements are 1101, 1102, 1106 and 1107. When the pressure F is applied on the display module 1104, because a housing 1103 and the display module 1104 of the mobile terminal are not in direct contact, that is, the display module 1104 can move upward and downward relative to the housing 1103 of the mobile terminal. The pressure F is transmitted to the pressure sensors 1101, 1102, 1106 and 1107 by means of the display module 1104, so that the first electrode plates in the pressure sensors are subject to pressures and deform. The four pressure sensors output detected voltages. The value of the pressure F can be detected according to the principles in the first to the fourth embodiments of the present disclosure. In other words, such a pressure detection apparatus can be used to sense a pressure value of finger touch control. In addition, if dedicated software with a measurement function is combined, a conventional mobile terminal can further provide a function of a high-precision electronic scale. In this way, the purpose of integrating multiple application functions in the mobile terminal is fulfilled, application scenarios of the mobile terminal are greatly expanded, and user experiences are improved.

It should be noted that the pressing elements in this embodiment need to be triggered by an external pressure to drive the first electrode plates to displace, and the pressing elements may be directly integrated with/located on the display module, or independent from the display module. For example, a surface of the display module of the mobile terminal may be directly pressed, to drive the first electrode plates to displace by means of a mechanical structure.

It should be noted that the modules involved in the embodiments are all logical modules. In actual applications, a logical unit may be a physical unit, or may be a part of a physical unit, or may be a combination of multiple physical units. In addition, to highlight innovative parts of the present disclosure, units that are not closely related to the technical problems proposed in the present disclosure are not introduced in the embodiments, but this does not indicate that other units do not exist in the embodiments.

A person of ordinary skill in the art can understand that all or some of the steps in the methods in the above embodiments can be completed by using a program instructing relevant hardware. The program is stored in a storage medium, and includes several instructions for causing a device (which may be a single-chip microcontroller or a chip) or a processor to perform all or some of the steps of the methods in the embodiments of this disclosure. The above storage medium includes: any medium that can store program code, such as a USB flash drive, a removable hard disk, a read-only memory (ROM), a random access memory (RAM), a magnetic disk, or an optical disc.

A person of ordinary skill in the art can understand that the foregoing embodiments are specific embodiments for implementing the present disclosure, and various changes may be made to the embodiments in forms and details in actual applications without departing from the spirit and scope of the present disclosure.

What is claimed is:

1. A pressure detection apparatus, comprising: a drive power supply, a differential circuit, a pressure calculation unit and at least one pressure sensor;
   each pressure sensor comprises a first electrode plate, a second electrode plate, a third electrode plate, a first elastic dielectric layer and a second elastic dielectric layer; the first electrode plate is disposed between the second electrode plate and the third electrode plate; the first elastic dielectric layer is disposed between the first electrode plate and the second electrode plate; the second elastic dielectric layer is disposed between the first electrode plate and the third electrode plate; wherein, one detection capacitor is formed between the first electrode plate and the second electrode plate, and one detection capacitor is formed between the first electrode plate and the third electrode plate;
   the pressure sensor is connected between the drive power supply and an input terminal of the differential circuit, and an output terminal of the differential circuit is connected to the pressure calculation unit;

the pressure sensor is configured to output two detection voltages across two terminals of each of the two detection capacitors when the first electrode plate is subject to an external pressure; the differential circuit is configured to output a voltage difference of the two detected voltages; and the pressure calculation unit is configured to calculate the pressure according to the voltage difference.

2. The pressure detection apparatus according to claim 1, wherein the first electrode plate is connected to the drive power supply, and the second electrode plate and the third electrode plate are connected to the input terminal of the differential circuit respectively.

3. The pressure detection apparatus according to claim 1, wherein the pressure detection apparatus further comprises: at least one charge switch and at least one discharge switch; the first electrode plate is grounded; and
the second electrode plate and the third electrode plate are respectively connected to the drive power supply by using the charge switch, and are respectively connected to the input terminal of the differential circuit by using the discharge switch.

4. The pressure detection apparatus according to claim 3, further comprising:
two charge switches, and the second electrode plate and the third electrode plate are respectively connected to the drive power supply by using the two charge switches; and/or
two discharge switches, and the second electrode plate and the third electrode plate are respectively connected to the input terminal of the differential circuit by using the two discharge switches; wherein
the two detection capacitors are charged when the charge switches are closed, and the two detection capacitors are discharged when the discharge switches are closed.

5. The pressure detection apparatus according to claim 3, further comprising:
one charge switch and the charge switch is a double-pole double-throw switch; and/or
one discharge switch and the discharge switch is a double-pole double-throw switch, wherein the two detection capacitors are charged when the charge switch is closed, and the two detection capacitors are discharged when the discharge switch is closed.

6. The pressure detection apparatus according to claim 1, wherein the pressure detection apparatus further comprises two adjustable capacitors; and
the two adjustable capacitors are connected in parallel to the two detection capacitors respectively, wherein the two adjustable capacitors are configured to adjust capacitance values of paths where each of the two detection capacitors locates, so that initial capacitance values of the paths where each of the two detection capacitors locates are equal when the first electrode plate is not subject to an external pressure.

7. The pressure detection apparatus according to claim 1, further comprising initial capacitance values of paths where each of the two detection capacitors locates are unequal when the first electrode plate is not subject to an external pressure; and
the pressure detection apparatus further comprises an adjustable capacitor, wherein the adjustable capacitor is connected in parallel to a detection capacitor on a path having a smaller initial capacitance value, wherein the adjustable capacitor is configured to adjust a capacitance value of the path where the detection capacitor connected in parallel to the adjustable capacitor locates, so that the initial capacitance values of the paths where each of the two detection capacitors locates are equal when the first electrode plate is not subject to an external pressure.

8. The pressure detection apparatus according to claim 1, further comprising multiple pressure sensors, and the pressure detection apparatus further comprises a switching unit; and
the multiple pressure sensors are switchably connected to the differential circuit by using the switching unit.

9. An intelligent terminal, comprising: a pressure detection apparatus, the pressure detection apparatus comprising: a drive power supply, a differential circuit, a pressure calculation unit and at least one pressure sensor;
each pressure sensor comprises a first electrode plate, a second electrode plate, a third electrode plate, a first elastic dielectric layer and a second elastic dielectric layer; the first electrode plate is disposed between the second electrode plate and the third electrode plate; the first elastic dielectric layer is disposed between the first electrode plate and the second electrode plate; the second elastic dielectric layer is disposed between the first electrode plate and the third electrode plate; wherein, one detection capacitor is formed between the first electrode plate and the second electrode plate, and one detection capacitor is formed between the first electrode plate and the third electrode plate;
the pressure sensor is connected between the drive power supply and an input terminal of the differential circuit, and an output terminal of the differential circuit is connected to the pressure calculation unit;
the pressure sensor is configured to output two detection voltages across two terminals of each of the two detection capacitors when the first electrode plate is subject to an external pressure; the differential circuit is configured to output a voltage difference of the two detected voltages; the pressure calculation unit is configured to calculate the pressure according to the voltage difference.

10. The intelligent terminal according to claim 9, wherein: the intelligent terminal comprises an active stylus, and the active stylus further comprises a stylus housing, a stylus core and an insulating stylus cap;
the pressure detection apparatus is mounted in the stylus housing;
one end of the stylus core is fixed to the first electrode plate of the pressure sensor; and
the insulating stylus cap is sleeved over the other end of the stylus core with a preset distance between the insulating stylus cap and the housing, and the preset distance is greater than or equal to a maximum deformation distance of the first electrode plate, wherein if the insulating stylus cap is subject to an external pressure, the pressure is applied on the first electrode plate of the pressure sensor by means of the stylus core.

11. The intelligent terminal according to claim 9, wherein the intelligent terminal comprises an apparatus with fingerprint recognition, and the apparatus with fingerprint recognition further comprises a fingerprint recognition module that is configured to recognize a fingerprint of a user, and a pressing element; and
one end of the pressing element is connected to the fingerprint recognition module, and the other end of the pressing element is connected to the first electrode plate of the pressure sensor, wherein if the fingerprint recognition module is subject to an external pressure, the pressure is applied on the first electrode plate of the pressure sensor by means of the pressing element.

12. The intelligent terminal according to claim 9, wherein the intelligent terminal comprises a mobile terminal, and the mobile terminal further comprises a terminal housing, a display module and multiple pressing elements;
the pressure detection apparatus is disposed in the terminal housing, and the number of pressure sensors is the same as that of pressing elements;
one end of each of the multiple pressing elements is respectively fixed to the display module, and the other end of each of the multiple pressing elements is respectively fixed to the first electrode plate of each of the multiple pressure sensors, wherein if the display module is subject to an external pressure, the pressure is applied on the first electrode plates of the multiple pressure sensors by means of the multiple pressing elements.

13. The intelligent terminal according to claim 9, wherein the first electrode plate is connected to the drive power supply, and the second electrode plate and the third electrode plate are connected to the input terminal of the differential circuit respectively.

14. The intelligent terminal according to claim 9, wherein the pressure detection apparatus further comprises: at least one charge switch and at least one discharge switch;
the first electrode plate is grounded; and
the second electrode plate and the third electrode plate are respectively connected to the drive power supply by using the charge switch, and are respectively connected to the input terminal of the differential circuit by using the discharge switch.

15. The intelligent terminal according to claim 14, further comprising: two charge switches, and the second electrode plate and the third electrode plate are respectively connected to the drive power supply by using the two charge switches; and/or
two discharge switches, and the second electrode plate and the third electrode plate are respectively connected to the input terminal of the differential circuit by using the two discharge switches; wherein the two detection capacitors are charged when the charge switches are closed, and the two detection capacitors are discharged when the discharge switches are closed.

16. The intelligent terminal according to claim 14, further comprising one charge switch and the charge switch is a double-pole double-throw switch; and/or
one discharge switch and the discharge switch is a double-pole double-throw switch, wherein the two detection capacitors are charged when the charge switch is closed, and the two detection capacitors are discharged when the discharge switch is closed.

17. The intelligent terminal according to claim 9, wherein the pressure detection apparatus further comprises two adjustable capacitors; and
the two adjustable capacitors are connected in parallel to the two detection capacitors respectively, wherein the two adjustable capacitors are configured to adjust capacitance values of paths where each of the two detection capacitors locates, so that initial capacitance values of the paths where each of the two detection capacitors locates are equal when the first electrode plate is not subject to an external pressure.

18. The intelligent terminal according to claim 9, further comprising initial capacitance values of paths where each of the two detection capacitors locates are unequal when the first electrode plate is not subject to an external pressure; and
the pressure detection apparatus further comprises an adjustable capacitor, wherein the adjustable capacitor is connected in parallel to a detection capacitor on a path having a smaller initial capacitance value, wherein the adjustable capacitor is configured to adjust a capacitance value of the path where the detection capacitor connected in parallel to the adjustable capacitor locates, so that the initial capacitance values of the paths where each of the two detection capacitors locates are equal when the first electrode plate is not subject to an external pressure.

19. The intelligent terminal according to claim 9, further comprising multiple pressure sensors, and the pressure detection apparatus further comprises a switching unit; and
the multiple pressure sensors are switchably connected to the differential circuit by using the switching unit.

* * * * *